(12) United States Patent
Gauthier, Jr. et al.

(10) Patent No.: US 8,759,194 B2
(45) Date of Patent: Jun. 24, 2014

(54) DEVICE STRUCTURES COMPATIBLE WITH FIN-TYPE FIELD-EFFECT TRANSISTOR TECHNOLOGIES

(75) Inventors: Robert J. Gauthier, Jr., Hinesburg, VT (US); Jeffrey B. Johnson, Essex Junction, VT (US); Junjun Li, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 17 days.

(21) Appl. No.: 13/455,732

(22) Filed: Apr. 25, 2012

(65) Prior Publication Data

US 2013/0285211 A1 Oct. 31, 2013

(51) Int. Cl.
*H01L 21/76* (2006.01)

(52) U.S. Cl.
USPC ............................ 438/403; 438/416; 438/479

(58) Field of Classification Search
USPC .......................................... 438/403, 416, 479
See application file for complete search history.

(56) References Cited

U.S. PATENT DOCUMENTS

| | | | |
|---|---|---|---|
| 4,047,986 A | 9/1977 | Hanoka | |
| 5,150,177 A | 9/1992 | Robinson et al. | |
| 5,268,316 A | 12/1993 | Robinson et al. | |
| 5,536,966 A | 7/1996 | Robinson et al. | |
| 7,173,310 B2 | 2/2007 | Voldman et al. | |
| 7,560,784 B2 | 7/2009 | Cheng et al. | |
| 7,696,040 B2 | 4/2010 | Zhu | |
| 7,700,449 B2 | 4/2010 | Lee | |
| 7,960,754 B2 | 6/2011 | Alter | |
| 7,964,893 B2 | 6/2011 | Lee | |
| 7,983,070 B2 | 7/2011 | Forbes | |
| 8,076,738 B2 | 12/2011 | Kolb et al. | |
| 2006/0063334 A1 | 3/2006 | Donze et al. | |
| 2007/0202659 A1 | 8/2007 | Donze et al. | |
| 2010/0004474 A1 | 1/2010 | Cantrell et al. | |
| 2010/0230774 A1 | 9/2010 | Alter | |
| 2011/0013668 A1 | 1/2011 | Pacha et al. | |
| 2011/0163356 A1 | 7/2011 | Zhu et al. | |
| 2011/0169101 A1 | 7/2011 | Doornbos et al. | |
| 2012/0187528 A1* | 7/2012 | Cheng et al. ................... 257/529 |
| 2013/0119482 A1* | 5/2013 | Wann et al. ..................... 257/401 |
| 2013/0134486 A1* | 5/2013 | LiCausi ......................... 257/288 |
| 2013/0207122 A1* | 8/2013 | Lin et al. .......................... 257/77 |
| 2013/0221491 A1* | 8/2013 | Wann et al. ..................... 257/618 |
| 2013/0224945 A1* | 8/2013 | Liu et al. ......................... 438/595 |

(Continued)

FOREIGN PATENT DOCUMENTS

WO 2010032174 A1 3/2010

OTHER PUBLICATIONS

J. Hwang, 20nm gate bulk-finFET SONOS flash, 2005 Electron Devices Meeting, Dec. 5, 2005.

(Continued)

*Primary Examiner* — Ngan Ngo
(74) *Attorney, Agent, or Firm* — Wood, Herron & Evans LLP; Anthony J. Canale (57) ABSTRACT

Device structures, design structures, and fabrication methods for fin-type field-effect transistor integrated circuit technologies. First and second fins, which constitute electrodes of the device structure, are each comprised of a first semiconductor material. The second fin is formed adjacent to the first fin to define a gap separating the first and second fins. Positioned in the gap is a layer comprised of a second semiconductor material.

18 Claims, 7 Drawing Sheets

(56) References Cited

U.S. PATENT DOCUMENTS

| | | | |
|---|---|---|---|
| 2013/0228778 A1* | 9/2013 | Tsai et al. | 257/48 |
| 2013/0228836 A1* | 9/2013 | Tsai et al. | 257/288 |
| 2013/0228862 A1* | 9/2013 | Lee et al. | 257/347 |

OTHER PUBLICATIONS

D. Fried et al., Comparison study of FinFETs: SOI vs. Bulk Performance, Manufacturing Variability and Cost, SOI industry Consortium. Oct. 21, 2009.

S. Thijs et al., Advanced ESD power clamp design for SOI FinFET CMOS technology, 2010 IEEE International Conference on IC Design and Technology. Jun. 4, 2010.

Griffoni et al., Next generation bulk FinFET devices and their benefits for ESD robustness, 31st EOS/ESD Symposium, Sep. 4, 2009.

C. Russ et al., ESD evaluation of the emerging MuGFET technology, 2005 Electrical Overstress/Electrostatic Discharge Symposium, Sep. 16, 2005.

Hwang, et al., "20 nm Gate Bulk-FinFET SONOS Flash", 2005 IEEE, 4 pages.

* cited by examiner

DEVICE STRUCTURES COMPATIBLE WITH FIN-TYPE FIELD-EFFECT TRANSISTOR TECHNOLOGIES

BACKGROUND

The present invention relates to semiconductor device fabrication and, more specifically, to device and design structures for fin-type field-effect transistor (FinFET) integrated circuit technologies, as well as methods of fabricating device structures in FinFET integrated circuit technologies.

A chip may be exposed to random electrostatic discharge (ESD) events that can direct potentially large and damaging ESD currents to the integrated circuits of the chip. Manufacturers, assemblers, and users of chips often take precautions to avoid causing ESD events or to militate against the effect of an ESD event. One such precaution is to incorporate an ESD prevention circuit into the chip. The ESD protection circuit prevents damage to the sensitive devices of the integrated circuits during post-manufacture handling. The ESD protection circuit may also function to protect the integrated circuits while the chip is installed on a circuit board or other carrier.

In the absence of an ESD event, the ESD protection circuit maintains an ESD protection device in a high-impedance, non-conductive state in which the ESD protection device is electrically isolated from the protected internal circuits. If an ESD event occurs, the ESD protection device is triggered by the ESD protection circuit to change from its non-conductive state to a low-impedance, conductive state. In its conductive state, the ESD protection device directs the ESD current to ground and away from the sensitive devices in the integrated circuits on the chip. The ESD protection device clamps the ESD protection device in its conductive state until the ESD current is drained and the ESD voltage is discharged to an acceptable level.

FinFETs are non-planar devices that are capable of being more densely packed in an integrated circuit than planar complementary metal-oxide-semiconductor (CMOS) transistors. In addition to the increase in packing density, a FinFET also offers superior short channel scalability, reduced threshold voltage swing, higher mobility, and the ability to operate at lower supply voltages than traditional planar CMOS transistors. Each FinFET features a narrow vertical fin of semiconductor material and a gate electrode that intersects a central channel of the fin. A thin gate dielectric layer separates the gate electrode from the fin. Heavily-doped source and drain regions are formed at opposite ends of the fin and border the central channel.

Improved device structures, design structures, and fabrication methods are needed for FinFET integrated circuit technologies.

SUMMARY

According to one embodiment of the present invention, a method of fabricating a device structure includes forming first and second fins each comprised of a first semiconductor material. The second fin is adjacent to the first fin to define a gap separating the first and second fins. The method further includes form a layer comprised of a second semiconductor material that is positioned in the gap separating the first and second fins. The first and second fins are electrodes of the device structure.

According to another embodiment of the present invention, a device structure includes first and second fins each comprised of a first semiconductor material. The second fin is adjacent to the first fin to define a gap separating the first and second fins. Positioned in the gap is a layer comprised of a second semiconductor material. The first and second fins are electrodes of the device structure.

According to another embodiment of the present invention, a design structure is provided that is readable by a machine used in design, manufacture, or simulation of an integrated circuit. The design structure includes first and second fins each comprised of a first semiconductor material. The second fin is adjacent to the first fin to define a gap separating the first and second fins. Positioned in the gap is a layer comprised of a second semiconductor material. The first and second fins are electrodes of a device structure. The design structure may comprise a netlist. The design structure may also reside on storage medium as a data format used for the exchange of layout data of integrated circuits. The design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
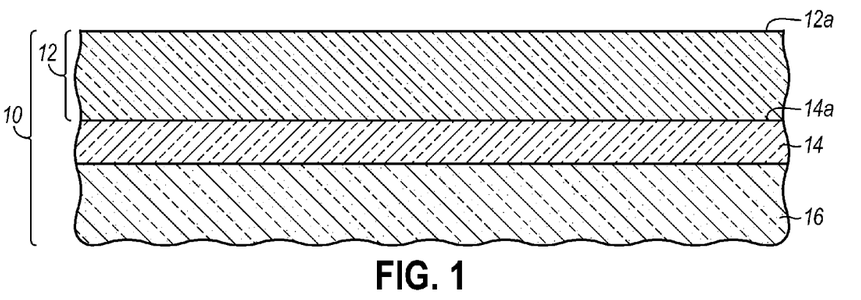
FIG. 1 is a cross-sectional view of a portion of a substrate at an initial fabrication stage of a processing method for forming a device structure from fins in accordance with an embodiment of the invention.

With reference to FIG. 1 and in accordance with an embodiment of the invention, a semiconductor-on-insulator (SOI) substrate 10 includes a device layer 12, a buried insulator layer 14 comprised of an electrical insulator, and a handle wafer 16. The buried insulator layer 14 may be a buried oxide layer comprised of silicon dioxide (e.g., $SiO_2$). The device layer 12 is separated from the handle wafer 16 by the intervening buried insulator layer 14 and is in direct contact along a planar interface with a top surface 14a of the buried insulator layer 14. The device layer 12 and handle wafer 16 may be comprised of single crystal or monocrystalline semiconductor material, such as single crystal silicon or another crystalline semiconductor material that contains primarily silicon, and the semiconductor material of the device layer 12 may be device quality. The device layer 12 may have a thickness ranging from two (2) nm to 150 nm. The buried insulator layer 14 electrically insulates the handle wafer 16 from the device layer 12, which is considerably thinner than the handle wafer 16. The SOI substrate 10 may be fabricated by any suitable conventional technique, such as wafer bonding techniques or separation by implantation of oxygen (SIMOX) techniques, familiar to a person having ordinary skill in the art.

Figure 2A:
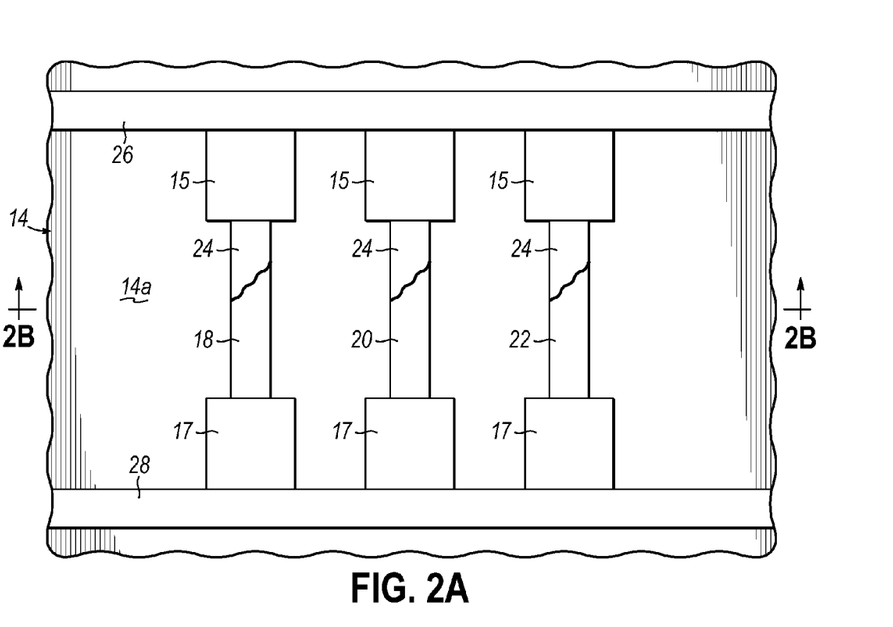
FIG. 2A is a top view of the substrate portion of a substrate at a fabrication stage subsequent to FIG. 1.
Figure 2B:
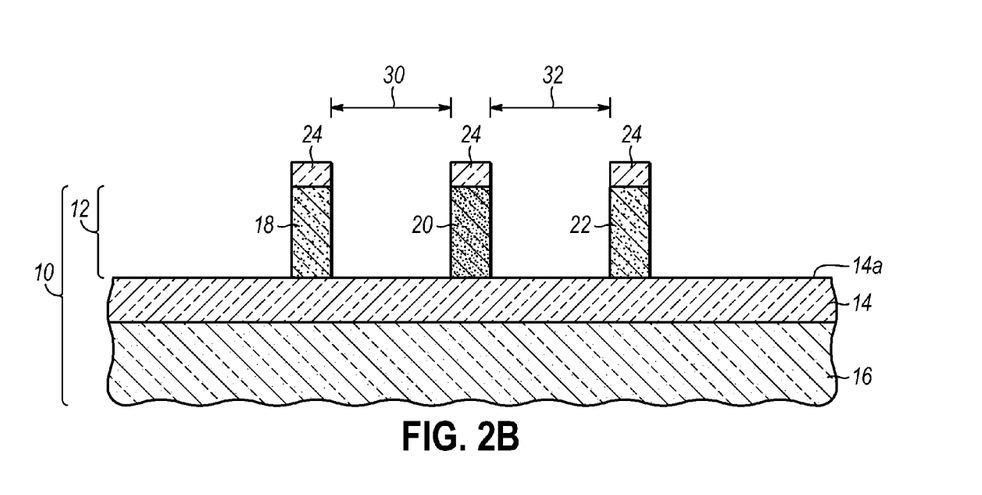
FIG. 2B is a cross-sectional view taken generally along line 2B-2B in FIG. 2A.

With reference to FIGS. 2A, 2B in which like reference numerals refer to like features in FIG. 1 and at a subsequent fabrication stage, a plurality of fins 18, 20, 22 are formed from the device layer 12 of the SOI substrate 10. Each of fins 18, 20, 22 is constituted by a three-dimensional block of semiconductor material originating from the device layer 12. The fins 18, 20, 22 are located between spaced-apart, parallel strips 26, 28 of a material, such as polysilicon. The fins 18, 20, 22 are adjacent to each other, but spaced apart laterally, and may be aligned parallel with each other. A gap 30 separates fin 18 from fin 20 and another gap 32 separates fin 20 from fin 22 in the parallel arrangement.

The fins 18, 20, 22 may be formed by photolithography and subtractive etching processes. To that end, the fins 18, 20, 22 may be formed using, for example, a sidewall image transfer (SIT) process that promotes dense packing. A cap material layer and a layer of a sacrificial material, such as polysilicon, are serially deposited on the top surface 12a of the device layer 12. The sacrificial material layer is patterned to define mandrels in the region of the device layer 12 used to form the fins 18, 20, 22. Spacers are then formed on the sidewalls of the mandrels. The mandrels are arranged such that the spacers are formed at the intended locations for the fins 18, 20, 22. The spacers may be formed from a sacrificial material that is shaped by an anisotropic etching process, such as RIE, that preferentially removes the dielectric material from horizontal surfaces. The sacrificial material used to form the spacers may comprise, for example, silicon nitride ($Si_3N_4$) conformally deposited by chemical vapor deposition (CVD). The mandrels are then selectively removed relative to the spacers using an etching process, such as RIE. The cap material layer and the device layer 12 are patterned with an etching process, such as RIE, using one or more etching chemistries while each spacer operates as an individual etch mask for one of the fins 18, 20, 22. The etching process stops on a top surface 14a of the buried insulator layer 14. Each of the fins 18, 20, 22 has a bottom surface that is in direct contact with the top surface 14a of the buried insulator layer 14. The spacers are retained on the top surface of each of the fins 18, 20, 22 as caps 24 but, in an alternative embodiment, may also be removed from their respective locations atop the channel sections of the fabricated fins 18, 20, 22.

Enlarged regions 15, 17 may be formed at opposite ends of each of the fins 18, 20, 22. The enlarged regions 15, 17, which are larger in size than the fins 18, 20, 22 and represent optional features in the completed device structure, may be formed by depositing a layer of semiconductor material and patterning the deposited semiconductor layer. FinFETs may be fabricated using fins similar or identical to fins 18, 20, 22 and source/drain regions similar or identical to the enlarged regions 15, 17. The fins of these FinFETs may be formed from sections of the device layer 12 at other locations on the SOI substrate 10 and, as apparent, on the same SOI substrate 10 as the device structures formed from fins 18, 20, 22. These FinFETs may be formed sharing at least one of the same fabrication steps as the processing method disclosed herein.

The fins 18, 20, 22 are doped with an impurity species to impart the constituent semiconductor material with a particular conductivity type. In the representative embodiment, the fin 20 is doped to have an opposite conductivity type from the channel regions of fins 18, 22. The doping may be provided by respective ion implantations, which may be angled to compensate for the presence of the caps 24 on the top surface of each of the fins 18, 20, 22.

Following the SIT process forming the fins 18, 20, 22, the source/drain regions 15, 17 are formed and then a mask is applied to cover at least the fins 18, 22. In one embodiment, the mask may be a resist layer that is applied by spin coating, pre-baked, exposed to radiation projected through a photomask to impart a latent image of a pattern that includes a window at the location of fin 20, and then developed with a chemical developer. The resist layer supplies a protective block mask covering the fins 18, 22. During implantation, the mask blocks dopant introduction into fins 18, 22 by stopping the implanted ions within its thickness so that only fin 20 receives a concentration of the dopant. The implantation conditions (e.g., kinetic energy and dose) are selected to provide the fin 20 with a desired doping concentration (e.g., heavy doping). In a representative embodiment, the constituent semiconductor material of fin 20 may have an n-type conductivity supplied by implanting ions of an impurity species from Group V of the Periodic Table (e.g., phosphorus (P), arsenic (As), or antimony (Sb)). After ion each implantation is complete, the mask is removed by, for example, oxygen plasma ashing or wet chemical stripping.

After fin 20 is doped, another mask is applied to cover at least the fin 20. In one embodiment, the mask may be a resist layer that is applied by spin coating, pre-baked, exposed to radiation projected through a photomask to impart a latent image of a pattern that includes windows at the locations of fins 18, 22, and then developed with a chemical developer. The resist layer supplies a protective block mask covering the fin 20. During implantation, the mask blocks dopant introduction into fin 20 by stopping the implanted ions within its thickness so that only fins 18, 22 receive a concentration of the dopant. The implantation conditions (e.g., kinetic energy and dose) are selected to provide the fins 18, 22 with a desired doping concentration (e.g., heavy doping). In a representative embodiment, the constituent semiconductor material of fins 18, 22 may have a p-type conductivity supplied by implanting ions of an impurity species from Group III of the Periodic Table (e.g., boron (B), aluminum (Al), gallium (Ga), or indium (In)). After ion each implantation is complete, the mask is removed by, for example, oxygen plasma ashing or wet chemical stripping.

The fins 18, 20, 22 may be doped by CMOS implants used to form the source and drain of fin-type field effect transistors, which may be fabricated using a different region of the SOI substrate 10. Alternatively, the fins 18, 20, 22 may be doped by dedicated implants unrelated to a CMOS process. In an alternative embodiment, the implantations may be performed in a reverse order such that fins 18, 22 are doped before fin 20 is doped.

As used herein, the dopant concentration in semiconductor material that is considered heavily doped may be at least an order of magnitude higher than the dopant concentration in semiconductor material that is considered lightly doped. The relative dopant concentrations for heavily-doped semiconductor material and lightly-doped semiconductor material are understood by a person having ordinary skill in the art. For example, a representative dopant concentration for heavily-doped semiconductor material may be greater than or equal to $10^{18}$ $cm^{-3}$, and a representative dopant concentration for lightly-doped semiconductor material may be less than or equal to $10^{16}$ $cm^{-3}$.

Figure 3A:
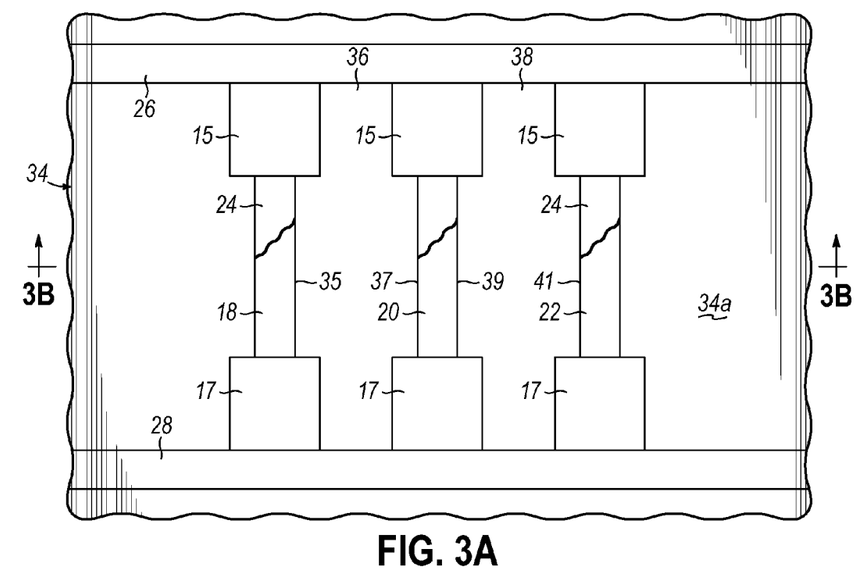
FIG. 3A is a top view of the substrate portion of FIG. 2A at a subsequent fabrication stage.
Figure 3B:
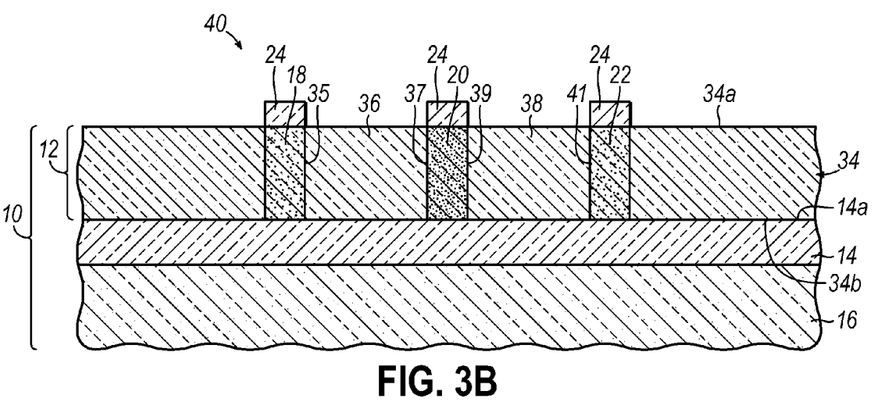
FIG. 3B is a cross-sectional view taken generally along line 3B-3B in FIG. 3A.

With reference to FIGS. 3A, 3B in which like reference numerals refer to like features in FIGS. 2A, 2B and at a subsequent fabrication stage, the gaps 30, 32 representing open spaces between the fins 18, 20, 22 are filled by an epitaxial layer 34. One portion 36 of epitaxial layer 34 is disposed in gap 30 and defines respective interfaces 35, 37 at boundaries shared with fins 18 and 20. Another portion 38 of epitaxial layer 34 is disposed in gap 32 and defines respective interfaces 39, 41 at boundaries shared with fins 20 and 22.

The epitaxial layer 34 is additive to the fins 18, 20, 22 to define a single, integral piece of semiconductor material. A top surface 34a of the epitaxial layer 34 is nominally coplanar with the top surfaces of the fins 18, 20, 22. A bottom surface 34b of the epitaxial layer 34 may directly contact the top surface 14a of the buried insulator layer 14. As a result, the thickness of the epitaxial layer 34 may be equal to the height of the fins 18, 20, 22, and may be nominally equal to the thickness of the device layer 12 used to form the fins 18, 20, 22. Portion 36 bridges the gap 30 to connect the fins 18, 20 and may be continuous and unbroken. Portion 38 bridges the gap 32 to connect the fins 20, 22 and may be continuous and unbroken. In the representative embodiment, fin 20 and the epitaxial layer 34 represent the only features between fin 18 and fin 22.

The epitaxial layer 34 may be comprised of the same semiconductor material as the device layer 12. In one embodiment, the epitaxial layer 34 may be comprised of a semiconductor material (e.g., silicon) formed by an epitaxial growth process, such as vapor-phase epitaxy (VPE). Epitaxial growth is a process by which a layer of single-crystal material (epitaxial layer 34) is deposited or grown on a single-crystal material (the fins 18, 20, 22) and in which the crystallographic structure of the single-crystal material is reproduced in the epitaxial layer 34. As a result, the fins 18, 20, 22 and epitaxial layer 34 may have identical crystallographic structures. The epitaxial layer 34 may be in situ doped during growth to introduce a concentration of an impurity or dopant to impart an opposite conductivity type from fin 20 and the same conductivity type as fins 18, 22. For example, an additional source gas such as phosphine, arsine, or diborane may be introduced into the growth chamber. The caps 24, which are optional, may prevent epitaxial growth on the top surface of the fins 18, 20, 22.

A device structure 40, which is a diode having a pair of electrodes or terminals, is defined by the fins 18, 20, 22 and the epitaxial layer 34. In one embodiment, the epitaxial layer 34 may be comprised of lightly-doped n-type semiconductor material to define an n-well, the fins 18, 22 may be comprised of heavily-doped p-type semiconductor material, and the fin 20 may be comprised of heavily-doped n-type semiconductor material. This arrangement of oppositely doped layers defines a lateral p$^+$/n-well diode as the device structure 40 with a p-n junction formed at the interface between fin 18 and the adjacent portion 36 of the epitaxial layer 34 and/or at the interface between fin 22 and the adjacent portion 38 of the epitaxial layer 34. In another embodiment, the epitaxial layer 34 may instead be comprised of lightly-doped p-type semiconductor material to define a p-well, and the device structure 40 is a lateral, planar n$^+$/p-well diode with p-n junctions formed at the interfaces between fin 22 and the adjacent portions 36, 38 of epitaxial layer 34. In either embodiment, fin 20 operates as one terminal or electrode of the device structure 40, and one or both of fins 18, 22 operate as the other terminal or electrode of the device structure 40.

In an alternative embodiment, the epitaxial layer 34 may be comprised of lightly-doped p-type semiconductor material to define a p-well, the fins 18, 22 may be comprised of heavily-doped n-type semiconductor material, and the fin 20 may be comprised of heavily-doped p-type semiconductor material. This arrangement of oppositely doped layers defines a lateral, planar n$^+$/p-well diode as the device structure 40 with a p-n junction formed at the interface between fin 18 and the adjacent portion 36 of epitaxial layer 34 and/or at the interface between fin 22 and the adjacent portion 38 of epitaxial layer 34. In another embodiment, the epitaxial layer 34 may instead be comprised of lightly-doped n-type semiconductor material to define a p-well, and the device structure 40 is a lateral, planar p$^+$/n-well diode having with p-n junctions formed at the interfaces between fin 20 and the portions 36, 38 of epitaxial layer 34. In either embodiment, fin 20 operates as one terminal or electrode of the device structure 40, and one or both of fins 18, 22 operate as the other terminal or electrode of the device structure 40.

Figure 4A:
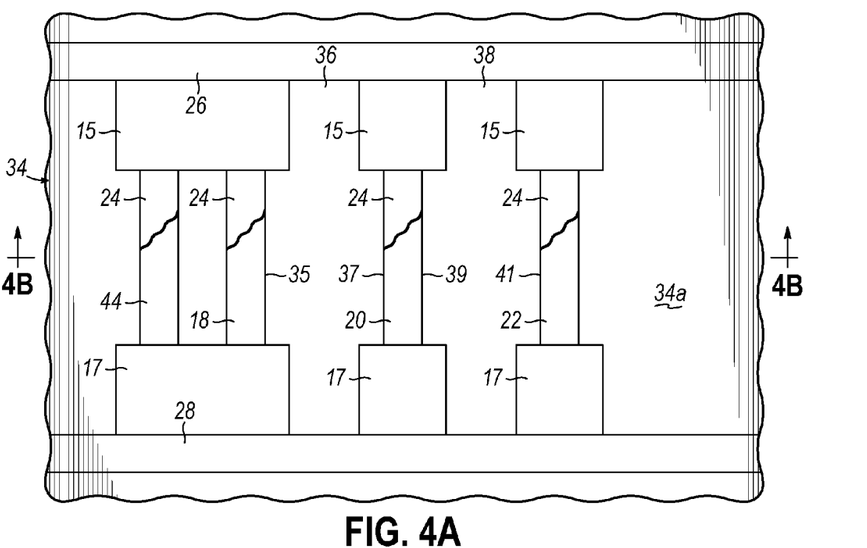
FIG. 4A is a top view similar to FIG. 3A of a device structure in accordance with an alternative embodiment of the invention
Figure 4B:
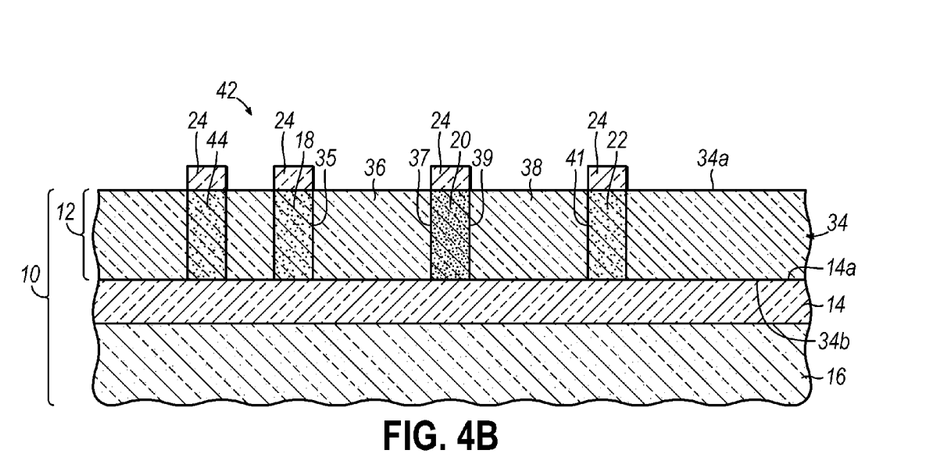
FIG. 4B is a cross-sectional view taken generally along line 4B-4B in FIG. 4A.

With reference to FIGS. 4A, 4B in which like reference numerals refer to like features in FIGS. 3, 3A and in accordance with an alternative embodiment, a device structure 42 may include an additional fin 44 that is adjacent to fin 18, but is otherwise similar to device structure 40. The enlarged sections of the fins 18, 44 are integral and shared by the narrow sections of the fins 18, 44 so that the fins 18, 44 define a fin array. The gap between the fins 20, 44 is occupied by another portion of the epitaxial layer 34. The fins 18, 44 may be concurrently doped with ion implantation to be comprised of semiconductor material having the same conductivity type.

Figure 5:
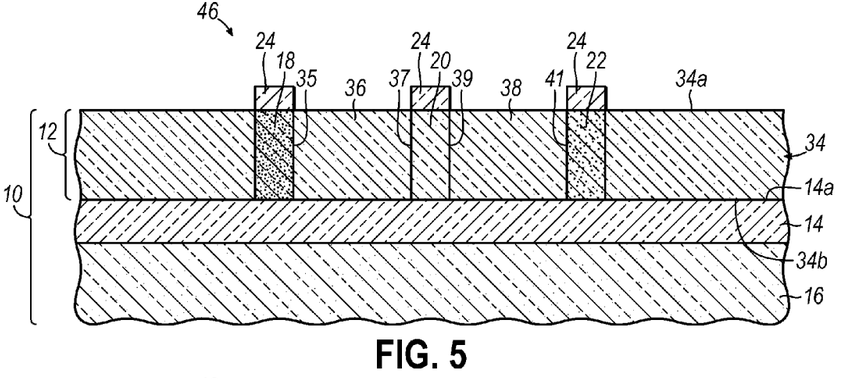
FIGS. 5-10 are cross-sectional views similar to FIG. 4B of device structures that are constructed in accordance with alternative embodiments of the invention.

With reference to FIG. 5 in which like reference numerals refer to like features in FIGS. 3, 3A and in accordance with an alternative embodiment, a device structure 46 is a modified version of device structure 40 in which fin 20 is not doped by ion implantation. The resist masks for the two implantations are configured such that the constituent semiconductor materials of fin 18 and fin 22 are doped to have opposite conductivity types. The mask operates as a block mask to protect the fin 20 from being implanted with dopant during either implantation. Fin 20 may comprise semiconductor material of an intrinsic conductivity type and operates as a single crystal seed for the growth of the epitaxial layer 34 in the two divided portions 36, 38. As a result, the presence of the fin 20 between fin 18 and fin 22 may permit the highly-doped fins 18, 22 to have a wider separation and may enhance epitaxial growth by reducing the occurrence of a seam between the fins 18, 22. The fin may also afford better control over the dopant profiles in the device structure 46 following any diffusion that may occur.

The fins 18, 22 and the epitaxial layer 34 of the device structure 46 define a diode having a pair of electrodes or terminals. In one embodiment, the epitaxial layer 34 may be comprised of lightly-doped n-type semiconductor material to define an n-well, the fin 18 may be comprised of heavily-doped p-type semiconductor material, and the fin 22 may be comprised of heavily-doped n-type semiconductor material. This arrangement of oppositely doped layers defines a lateral p$^+$/n-well diode as the device structure 46 with a p-n junction formed at the interface between fin 18 and the adjacent portion 36 of the epitaxial layer 34.

In another embodiment, the epitaxial layer 34 may be comprised of lightly-doped p-type semiconductor material to define a p-well, and the device structure 46 is a lateral, planar n$^+$/p-well diode with a p-n junction formed at the interface between fin 22 and the adjacent portion 36 of epitaxial layer 34. In either embodiment, fin 18 operates as one terminal or electrode of the device structure 46 and fin 22 operates as the other terminal or electrode of the device structure 46.

Figure 6:
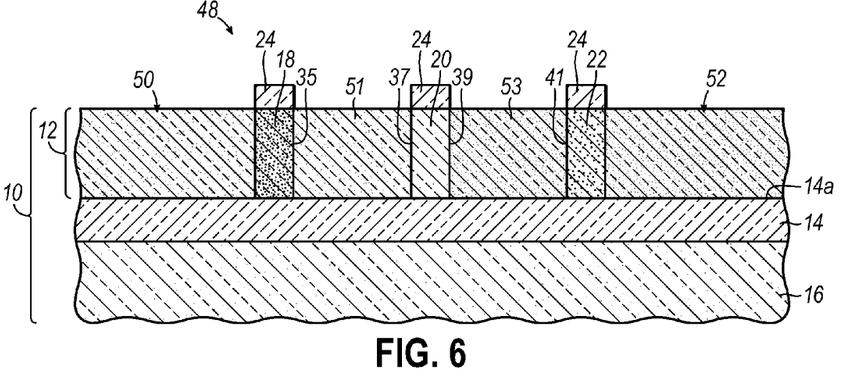

With reference to FIG. 6 in which like reference numerals refer to like features in FIG. 5 and in accordance with an alternative embodiment, a device structure 48 is a modified version of device structure 46 in which the conductivity type of the fins 18, 20, 22 is unchanged, but for which multiple epitaxial layers 50, 52 are formed to fill the gaps 30, 32 (FIGS. 2A, 2B). The epitaxial layers 50, 52 are comprised of semiconductor material doped to have opposite conductivity types during growth. Epitaxial layers 50, 52 are formed as described above for epitaxial layer 34. Before epitaxial layer 50 is formed, a hard mask is applied that covers gap 32 so that, after formation and removal of the hard mask, epitaxial layer 50 is present in gap 30 but not present in gap 32. Similarly, before epitaxial layer 52 is formed, a hard mask is applied that covers the portion of epitaxial layer 50 in gap 32 and the fins 18, 20 so that, after formation and removal of the hard mask, epitaxial layer 52 is present gap 30 but not present in gap 32. Portions of the epitaxial layers 50, 52 also form on the buried insulator layer 14 peripherally outside of the fins 18, 22. The caps 24 may prevent epitaxial growth on the top surface of the fins 18, 20, 22.

The portion 51 of the epitaxial layer 50 between fins 18, 20 in gap 30 participates in the respective interfaces 35, 37 at the respective boundaries shared with fins 18 and 20. The portion 53 of the epitaxial layer 52 between fins 20, 22 in gap 32 participates in the respective interfaces 39, 41 at the respective boundaries shared with fins 20 and 22. The epitaxial layers 50, 52 are additive to the fins 18, 20, 22 to define a single, integral piece of semiconductor material.

The device structure 48 has a layer and junction arrangement characteristic of a silicon controlled rectifier (SCR). The interface 35 defines a p-n junction and the interface 41 defines another p-n junction. Another p-n junction is collectively defined by the fin 20 and the portions of the epitaxial layers 50, 52 proximate to the fin 20. Dopant diffusion during subsequent thermal processes or a dedicated thermal anneal may form the p-n junction, which may be positioned inside of the fin 20 between the interfaces 37, 39. The fins 18, 22 define two of the electrodes or terminals of the device structure 48. Specifically, fin 18 may represent a cathode of the device structure 48, and fin 22 may represent an anode of the device structure 48.

Figure 7:
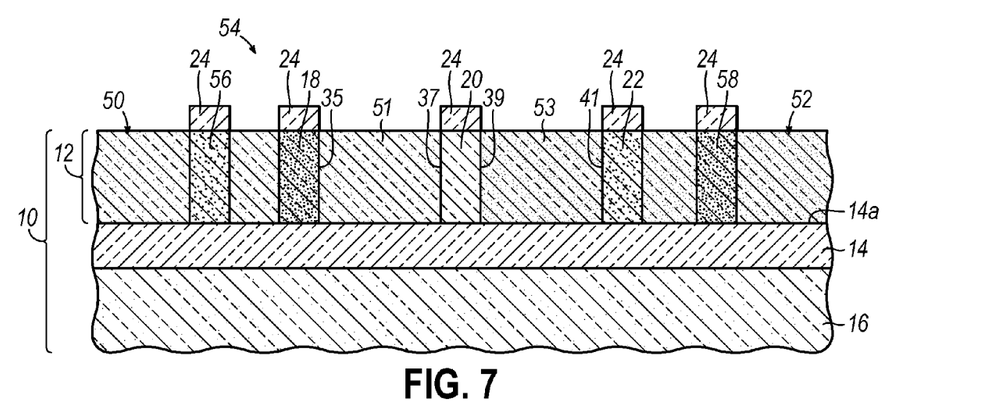

With reference to FIG. 7 in which like reference numerals refer to like features in FIG. 6 and in accordance with an alternative embodiment, a device structure 54 is a modified version of device structure 48 in which fins 56, 58 are added to the construction of device structure 48. Fins 56, 58 are formed when fins 18, 20, 22 are formed. Similarly, fins 56, 58 are doped by the same processes used to dope the fins 18, 20, 22. Fin 56 has an opposite conductivity type from the adjacent fin 18 and is positioned within the epitaxial layer 50 along with fin 18 after the epitaxial layer 50 is formed. Fin 56 supplies a body contact with the epitaxial layer 50. Fin 58 has an opposite conductivity type from the adjacent fin 22 and is positioned within the epitaxial layer 52 along with fin 22 after the epitaxial layer 52 is formed. Fin 58 supplies a body contact with the epitaxial layer 52.

Figure 8:
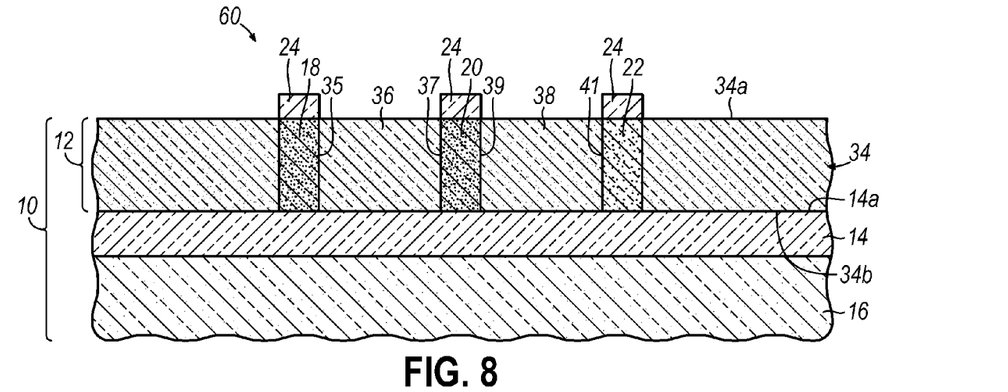

With reference to FIG. 8 in which like reference numerals refer to like features in FIGS. 3A, 3B and in accordance with an alternative embodiment, a device structure 60 is a modified version of device structure 40 in which fin 22 has an opposite conductivity type from fins 18, 20. The ion implantations and the resist masks for the ion implantations are adjusted such that the constituent semiconductor material of fin 22 is doped to have an opposite conductivity type from fins 18, 20.

In one embodiment, the epitaxial layer 34 may be comprised of lightly-doped p-type semiconductor material to define a p-well, the fins 18, 20 may be comprised of heavily-doped n-type semiconductor material, and the fin 22 may be comprised of heavily-doped p-type semiconductor material. This arrangement of oppositely doped layers defines a lateral, planar NPN bipolar junction transistor as the device structure 60 with the fins 18, 20 and the portion 36 of epitaxial layer 34 defining device layers and the fin 22 serving as a well contact. The fins 18, 20 define the emitter and collector of the NPN bipolar junction transistor and the portion 36 of epitaxial layer 34 between the fins 18, 20 defines the base of the NPN bipolar junction transistor. The p-n junction between the n-type collector (fin 20) and the p-type base (portion 38 of epitaxial layer 34) is the collector-base junction that has the base as the anode and the collector as the cathode. The p-n junction between the n-type emitter (fin 18) and the p-type base (portion 36 of epitaxial layer 34) is the emitter-base junction that has the base as the anode and the emitter as the cathode.

In another embodiment, the epitaxial layer 34 may be comprised of lightly-doped n-type semiconductor material to define a p-well, the fins 18, 20 may be comprised of heavily-doped p-type semiconductor material, and the fin 22 may be comprised of heavily-doped n-type semiconductor material. This arrangement of oppositely doped layers defines a lateral, planar PNP bipolar junction as the device structure 60.

In both embodiments, fin 18 operates as one terminal or electrode of the device structure 60, and fin 20 operates as the other terminal or electrode of the device structure 60.

Figure 9:
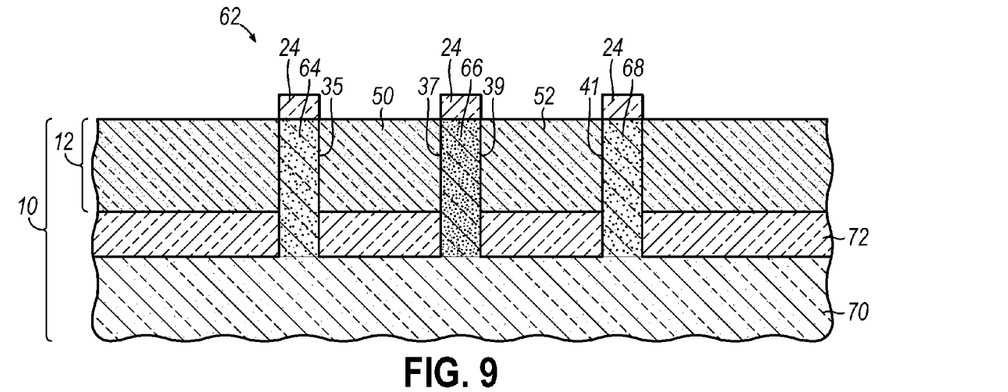

With reference to FIG. 9 in which like reference numerals refer to like features in FIG. 3B and in accordance with an alternative embodiment, a device structure 62 includes a plurality of fins 64, 66, 68 similar to fins 18, 20, 22 but is modified to be fabricated using a bulk substrate 70 instead of the SOI substrate 10. The fins 64, 66, 68 are formed by patterning a surface layer of the bulk substrate 70 using photolithography and etching. A dielectric layer 72 is formed that provides electrical isolation for the fins 64, 66, 68. The dielectric layer 72 is comprised of an electrically-insulating dielectric material, such as $SiO_2$, that may be deposited using CVD. After planarizing with, for example, a chemical mechanical polishing (CMP) process relative to the capped top surfaces of the fins 64, 66, 68, a timed etch may be used to recess the dielectric layer 72 relative to the fins 64, 66, 68. The epitaxial layer 34 is then grown as described hereinabove to form the portions 36, 38, in which portion 36 define respective interfaces 35, 37 with fins 64 and 66, and portion 38 defines respective interfaces 39, 41 with fins 64 and 68. The fins 64, 66, 68 of the device structure 62 may be configured as described above for the device structures 42, 46, 48, 54, 60, 62.

The device structures 40, 42, 46, 48, 54, 60, 62 may be used as a protection element in an electrostatic discharge (ESD) protection circuit configured to discharge current from an ESD pulse or, alternatively, the device structures may be used in a different type of circuit that does not involve ESD protection.

Figure 10:
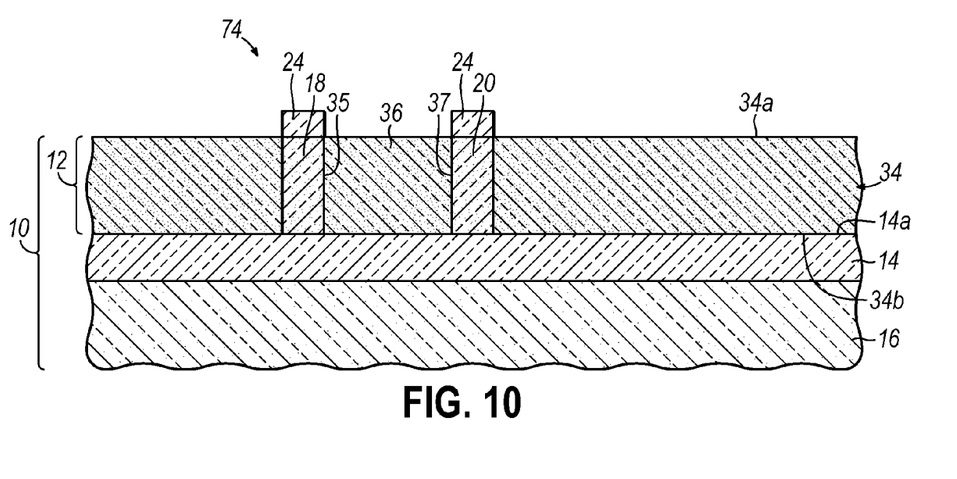

With reference to FIG. 10 in which like reference numerals refer to like features in FIG. 3B and in accordance with an alternative embodiment, a device structure 74 includes fins 18, 20 that are doped to have the same conductivity type, but may omit fin 22 from its construction. The epitaxial layer 34 is in situ doped during growth to comprise lightly-doped semiconductor material of the same conductivity type as the heavily-doped semiconductor material of the fins 18, 20. In this construction, the device structure 74 is a resistor having a resistance value determined by selection of, among other variables, the composition of the epitaxial layer 34, the thickness of the epitaxial layer 34, and the planar geometry of the portion 36 of the epitaxial layer 34 between the fins 18, 20. Fin 18 operates as one terminal or electrode of the device structure 74, and fin 20 operates as the other terminal or electrode of the device structure 74.

The epitaxial layer 34 used to form device structures 40, 42, 46, 54, 60 and the epitaxial layers 50, 52 used to form device structures 48, 62 may be trimmed so that the each device has a defined footprint on the top surface 14a of the buried insulator layer 14.

Figure 11:
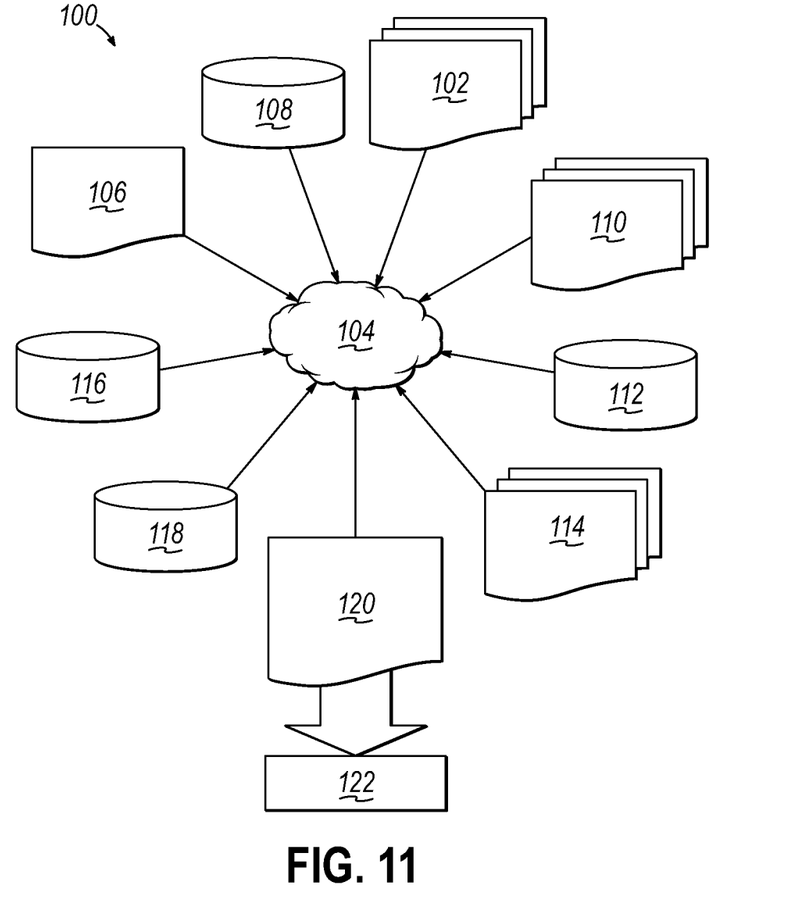
FIG. 11 is a flow diagram of a design process used in semiconductor design, manufacture, and/or test.

FIG. 11 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 4A,B and FIGS. 5-10. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 4A,B and FIGS. 5-10. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 4A,B and FIGS. 5-10 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 4A,B and FIGS. 5-10. In one embodiment, design structure 120 may comprise a compiled, executable HDL simulation model that functionally simulates the devices shown in FIGS. 4A,B and FIGS. 5-10.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 4A,B and FIGS. 5-10. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a device structure, the method comprising:
   forming a first fin;
   forming a second fin adjacent to the first fin to define a gap separating the first fin from the second fin; and
   forming a first layer in the gap between the first fin and the second fin,
   wherein the first fin and the second fin are comprised of a first semiconductor material, the first layer is comprised of a second semiconductor material, and the first fin is a first electrode of the device structure and the second fin is a second electrode of the device structure.

2. The method of claim 1 further comprising:
   doping the first semiconductor material of the first fin to have a first conductivity type; and
   doping the first semiconductor material of the second fin to a second conductivity type opposite to the first conductivity type.

3. The method of claim 2 further comprising:
   before the first layer is formed, forming a third fin comprised of the first semiconductor material and positioned between in the gap between the first fin and the second fin,
   wherein the first semiconductor material of the third fin has intrinsic conductivity, and the third fin divides the first layer into first and second portions of the second semiconductor material.

4. The method of claim 2 further comprising:
   doping the second semiconductor material of the first layer during formation to have the first conductivity type;
   forming a second layer comprised of the second semiconductor material in the gap between the first fin and the second fin; and
   doping the second semiconductor material of the second layer during formation to have the second conductivity type,
   wherein the first and second and second layers are juxtaposed in the gap to define a first p-n junction, the first fin has an interface with the second layer to define a second p-n junction, and the second fin has an interface with the first layer to define a third p-n junction.

5. The method of claim 1 further comprising:
   doping the first semiconductor material of the first fin and the first semiconductor material of the second fin to have a first conductivity type.

6. The method of claim 5 wherein forming the first layer comprised of the second semiconductor material in the gap between the first fin and the second fin further comprises:
   epitaxially growing the second semiconductor material using the first fin and the second fin as crystal seeds so that the first layer has an interface with the first fin and the first layer has a second interface with the second fin.

7. The method of claim 6 further comprising:
   doping the second semiconductor material of the first layer during epitaxial growth to have the first conductivity type,
   wherein the second semiconductor material of the first layer is more lightly doped than the first semiconductor material of the first fin and the second fin.

8. The method of claim 6 further comprising:
   doping the second semiconductor material of the first layer during growth to have a second conductivity type opposite from the first conductivity type.

9. The method of claim 1 further comprising:
   forming a third fin physically coupled with the first fin to define a fin array.

10. The method of claim 1 wherein the first fin and the second fin are formed from a device layer of a semiconductor-on-insulator substrate, and the first layer, the first fin, and the second fin directly each contact a top surface of a buried insulator layer of the semiconductor-on-insulator substrate.

11. The method of claim 1 wherein forming the first layer comprised of the second semiconductor material in the gap between the first fin and the second fin further comprises:

after the first fin and the second fin are formed, epitaxially growing the first layer using the first fin and the second fin as crystal seeds, wherein the first layer connects the first fin with the second fin.

12. The method of claim 1 further comprising:

after the first fin and the second fin are formed, forming a dielectric layer that separates the first fin from the second fin to provide electrical isolation.

13. The method of claim 1 wherein the first fin and the second fin are simultaneously formed.

14. The method of claim 1 wherein the first fin and the second fin are simultaneously formed by patterning a device layer of a semiconductor-on-insulator substrate.

15. The method of claim 3 wherein the first fin, the second fin, and the third fin are simultaneously formed.

16. The method of claim 3 wherein the first fin, the second fin, and the third fin are simultaneously formed by patterning a device layer of a semiconductor-on-insulator substrate.

17. The method of claim 4 further comprising:

before the first and second layers are formed, forming a third fin comprised of the first semiconductor material and positioned between in the gap between the first fin and the second fin, wherein the first semiconductor material of the third fin has intrinsic conductivity, and the third fin is disposed between the first layer and the second layer.

18. The method of claim 1 wherein the first layer bridges the gap between the first fin and the second fin to connect the first fin with the second fin.

\* \* \* \* \*